(12) United States Patent
Zhang et al.

(10) Patent No.: US 11,688,451 B2
(45) Date of Patent: Jun. 27, 2023

(54) APPARATUSES, SYSTEMS, AND METHODS FOR MAIN SKETCH AND SLIM SKETCH CIRCUIT FOR ROW ADDRESS TRACKING

(71) Applicant: MICRON TECHNOLOGY, INC., Boise, ID (US)

(72) Inventors: Yu Zhang, Shanghai (CN); Liang Li, Shanghai (CN)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/456,849

(22) Filed: Nov. 29, 2021

(65) Prior Publication Data

US 2023/0170008 A1    Jun. 1, 2023

(51) Int. Cl.
*G11C 11/406* (2006.01)

(52) U.S. Cl.
CPC .................. *G11C 11/406* (2013.01)

(58) Field of Classification Search
CPC ...................................... G11C 11/406
USPC ......................................... 365/222
See application file for complete search history.

(56) References Cited

U.S. PATENT DOCUMENTS

| | | |
|---|---|---|
| 1,158,364 A | 10/1915 | Bibb |
| 3,633,175 A | 1/1972 | Harper |
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |

(Continued)

FOREIGN PATENT DOCUMENTS

| | | |
|---|---|---|
| CN | 1144434 A | 3/1997 |
| CN | 1195173 A | 10/1998 |

(Continued)

OTHER PUBLICATIONS

US 11,264,075 B2, 03/2022, Bell et al. (withdrawn)

(Continued)

*Primary Examiner* — Connie C Yoha
(74) *Attorney, Agent, or Firm* — Dorsey & Whitney LLP

(57) ABSTRACT

Apparatuses, systems, and methods for main sketch and slim sketch circuits for address tracking. The main sketch circuit receives a row address and changes selected count values in a first storage structure based on hash values generated based on the row address. Those count values are compared to a first threshold, and if that threshold is exceeded, a slim sketch circuit also receives the row address and changes selected count values in a second storage structure based on hash values generated based on the row address. Based on the selected count values from the first storage structure, the second storage structure, or combinations thereof, the row address may be determined to be an aggressor address.

20 Claims, 5 Drawing Sheets

(56) References Cited

U.S. PATENT DOCUMENTS

| | | |
|---|---|---|
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,304,875 B1 | 12/2007 | Lien et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 7,870,362 B2 | 1/2011 | Hong et al. |
| 7,872,907 B2 | 1/2011 | Okayama et al. |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,676,725 B1 | 3/2014 | Lin et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 * | 2/2022 | Shore ............... G11C 11/406 |
| 11,264,096 B2 | 3/2022 | Schreck et al. |
| 11,322,192 B2 | 5/2022 | Morohashi et al. |
| 11,361,808 B2 | 6/2022 | Bell et al. |
| 11,386,946 B2 | 7/2022 | Ayyapureddi et al. |
| 11,398,265 B2 | 7/2022 | Wu et al. |
| 11,424,005 B2 * | 8/2022 | Penney ............ G11C 11/4078 |
| 11,462,291 B2 | 10/2022 | Pan |
| 11,482,275 B2 | 10/2022 | Ayyapureddi et al. |
| 11,521,669 B2 | 12/2022 | Enomoto et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0213035 A1 | 10/2004 | Cavaleri et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |

(56) References Cited

U.S. PATENT DOCUMENTS

| | | |
|---|---|---|
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0313494 A1 | 12/2008 | Hummler et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0000670 A1 | 1/2014 | Greenfield et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1 | 6/2014 | Song |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0224262 A1 | 8/2016 | Mandava et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |

(56) References Cited

U.S. PATENT DOCUMENTS

| | | |
|---|---|---|
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-Tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0350844 A1 | 11/2021 | Morohashi et al. |
| 2021/0398592 A1 | 12/2021 | Penney et al. |
| 2021/0407583 A1 | 12/2021 | Penney et al. |
| 2022/0069992 A1* | 3/2022 | Ayyapureddi ...... G06F 11/1068 |
| 2022/0165347 A1 | 5/2022 | Pan |
| 2022/0230672 A1 | 7/2022 | Ayyapureddi et al. |
| 2022/0293166 A1* | 9/2022 | Ayyapureddi ......... G11C 29/44 |
| 2022/0415427 A1 | 12/2022 | Pan |
| 2023/0010619 A1 | 1/2023 | Ayyapureddi et al. |

FOREIGN PATENT DOCUMENTS

| | | |
|---|---|---|
| CN | 101038785 A | 9/2007 |
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 20150002112 A | 1/2015 |
| KR | 20150002783 A | 1/2015 |
| KR | 20170058022 A | 5/2017 |
| KR | 1020180064940 A | 6/2018 |
| KR | 1020180085184 A | 7/2018 |
| KR | 20190048049 A | 5/2019 |
| WO | 2014120477 | 8/2014 |
| WO | 2015030991 A1 | 3/2015 |
| WO | 2017171927 A1 | 10/2017 |
| WO | 2019222960 A1 | 11/2019 |

(56) References Cited

FOREIGN PATENT DOCUMENTS

| WO | 2020010010 A1 | 1/2020 |
|---|---|---|
| WO | 2020191222 A1 | 9/2020 |
| WO | 2021003085 A1 | 1/2021 |
| WO | 2022108808 A1 | 5/2022 |

OTHER PUBLICATIONS

U.S. Appl. No. 17/932,206, titled, "Apparatuses and Methods for Dynamically Allocated Aggressor Detection", filed Sep. 14, 2022; pp. all pages of application as filed.

U.S. Appl. No. 17/565,119 titled "Apparatuses and Methods for Row Hammer Counter Mat", filed Dec. 29, 2021.

U.S. Appl. No. 17/565,187 titled "Apparatuses and Methods for Row Hammer Counter Mat", filed Dec. 29, 2021.

U.S. Appl. No. 17/822,033, titled, "Apparatuses and Methods for Tracking Word Line Accesses", filed Aug. 24, 2022, pp. all pages of applciation as filed.

International Application No. PCT/US20/23689, titled "Semiconductor Device Having Cam That Stores Address Signals", dated Mar. 19, 2020; pp. all pages of application as filed.

U.S. Appl. No. 15/884,192 entitled 'Semiconductor Device Performing Row Hammer Refresh Operation', filed Jan. 30, 2018; pp. all pages of application as filed.

U.S. Appl. No. 16/797,658, titles "Apparatuses and Methods for Controlling Refresh Operations", filed Feb. 21, 2020; pp. all pages of application as filed.

U.S. Appl. No. 16/818,981 titled "Apparatuses and Methods for Staggered Timing of Targeted Refresh Operations", filed Mar. 13, 2020; pp. all pages of application as filed.

U.S. Appl. No. 16/824,460, titled "Semiconductor Device Performing Row Hammer Refresh Operation", filed Mar. 19, 2020; pp. all pages of application as filed.

U.S. Appl. No. 16/025,844, titled "Apparatus and Methods for Triggering Row Hammer Address Sampling", filed Jul. 2, 2018; pp. all pages of application as filed.

U.S. Appl. No. 16/783,063, titled "Apparatus and Methods for Triggering Row Hammer Address Sampling", filed Feb. 5, 2020; pp. all pages of application as filed.

U.S. Appl. No. 16/805,197, titled "Apparatuses and Methods for Calculating Row Hammer Refresh Addresses in a Semiconductor Device", filed Feb. 28, 2020; pp. all pages of application as filed.

U.S. Appl. No. 16/232,837, titled "Apparatuses and Methods for Distributed Targeted Refresh Operations", filed Dec. 26, 2018; pp. all pages of application as filed.

U.S. Appl. No. 16/818,989, titled "Semiconductor Device Performing Row Hammer Refresh Operation", filed Mar. 13, 2020; pp. all pages of application as filed.

U.S. Appl. No. 16/268,818, titled "Apparatuses and Methods for Managing Row Access Counts", filed Feb. 6, 2019; pp. all pages of application as filed.

U.S. Appl. No. 16/286,187 titled "Apparatuses and Methods for Memory Mat Refresh Sequencing", filed Feb. 26, 2019; pp. all pages of application as filed.

U.S. Appl. No. 16/084,119, titled "Apparatuses and Methods for Pure-Time, Self Adopt Sampling for Row Hammer Refresh Sampling", filed Sep. 11, 2018; pp. all pages of application as filed.

U.S. Appl. No. 16/886,284 titled "Apparatuses and Methods for Access Based Refresh Timing", filed May 28, 2020; pp. all pages of application as filed.

U.S. Appl. No. 16/358,587, titled "Semiconductor Device Having Cam That Stores Address Signals", filed Mar. 19, 2019; pp. all pages of application as filed.

U.S. Appl. No. 16/375,716 titled "Apparatuses and Methods for Staggered Timing of Targeted Refresh Operations", filed Apr. 4, 2019; pp. all pages of application as filed.

U.S. Appl. No. 16/936,297 titled "Apparatuses and Methods for Managing Row Access Counts", filed Jul. 22, 2020; pp. all pages of application as filed.

U.S. Appl. No. 16/411,573 titled "Apparatuses, Systems, and Methods for a Content Addressable Memory Cell", filed May 14, 2019; pp. all pages of application as filed.

U.S. Appl. No. 16/428,625 titled "Apparatuses and Methods for Tracking Victim Rows", filed May 31, 2019: pp. all pages of application as filed.

U.S. Appl. No. 16/513,400 titled "Apparatuses and Methods for Tracking Row Accesses", filed Jul. 16, 2019; pp. all pages of application as filed.

U.S. Appl. No. 17/060,403 titled "Apparatuses and Methods for Adjusting Victim Data", filed Oct. 1, 2020; pp. all pages of application as filed.

U.S. Appl. No. 16/548,027 titled "Apparatuses, Systems, and Methods for Analog Row Access Rate Determination", filed Aug. 22, 2019; pp. all pages of application as filed.

U.S. Appl. No. 16/549,942 titled "Apparatuses and Methods for Lossy Row Access Counting", filed Aug. 23, 2019; pp. all pages of application as filed.

U.S. Appl. No. 16/546,152 titled "Apparatuses and Methods for Analog Row Access Tracking", filed Aug. 20, 2019; pp. all pages of application as filed.

U.S. Appl. No. 16/549,411 titled "Apparatuses and Methods for Dynamic Refresh Allocation", filed Aug. 23, 2019; pp. all pages of application as filed.

U.S. Appl. No. 16/655,110 titled "Apparatuses and Methods for Dynamic Targeted Refresh Steals", filed Oct. 16, 2019; pp. all pages of application as filed.

U.S. Appl. No. 17/154,945 titled "Apparatuses, Systems, and Methods for a Content Addressable Memory Cell", filed Jan. 21, 2021; pp. all pages of application as filed.

U.S. Appl. No. 17/170,616 titled "Apparatuses, Systems, and Methods for Analog Row Access Rate Determination", filed Feb. 8, 2021; pp. all pages of application as filed.

U.S. Appl. No. 17/168,036 titled "Apparatuses and Methods for Analog Row Access Tracking", filed Feb. 4, 2021; pp. all pages of application as filed.

U.S. Appl. No. 17/301,533 titled "Semiconductor Device Having Cam That Stores Address Signals", filed Apr. 6, 2021; pp. all pages of application as filed.

U.S. Appl. No. 17/443,056 titled "Apparatuses and Methods for Multiple Row Hammer Refresh Address Sequences", filed Jul. 20, 2021; pp. all pages of application as filed.

International Application No. PCT/US19/40169 titled "Apparatus and Methods for Triggering Row Hammer Address Sampling" filed Jul. 1, 2019; pp. all pages of application as filed.

International Application No. PCT/US19/64028, titled "Semiconductor Device Performing Row Hammer Refresh Operation", dated Dec. 2, 2019; pp. all pages of application as filed.

International Application No. PCT/US20/26689, titled "Apparatuses and Methods for Staggered Timing of Targeted Refresh Operations", dated Apr. 3, 2020; pp. all pages of application as filed.

International Application No. PCT/US20/40077, titled "Apparatuses and Methods for Monitoring Word Line Accesses", dated Jun. 29, 2020; pp. all pages of application as filed.

U.S. Appl. No. 17/375,817 titled "Apparatuses and Methods for Monitoring Word Line Accesses", filed Jul. 14, 2021; pp. all pages of application as filed.

U.S. Appl. No. 16/788,657, titled "Semiconductor Device Performing Row Hammer Refresh Operation", filed Feb. 12, 2020; pp. all pages of application as filed.

U.S. Appl. No. 15/881,256 entitled 'Apparatuses and Methods for Detecting a Row Hammer Attack With a Bandpass Filter', filed Jan. 26, 2018; pp. all pages of application as filed.

U.S. Appl. No. 16/425,525 titled "Apparatuses and Methods for Tracking All Row Accesses", filed May 29, 2019; pp. all pages of application as filed.

U.S. Appl. No. 16/427,105 titled "Apparatuses and Methods for Priority Targeted Refresh Operations", filed May 30, 2019; pp. all pages of application as filed.

U.S. Appl. No. 16/427,140 titled "Apparatuses and Methods for Tracking Row Access Counts Between Multiple Register Stacks", filed May 30, 2019; pp. all pages of application as filed.

(56) References Cited

OTHER PUBLICATIONS

U.S. Appl. No. 16/437,811 titled "Apparatuses, Systems, and Methods for Determining Extremum Numerical Values", filed Jun. 11, 2019; pp. all pages of application as filed.
U.S. Appl. No. 16/537,981 titled "Apparatuses and Methods for Controlling Targeted Refresh Rates", filed Aug. 12, 2019; pp. all pages of application as filed.
U.S. Appl. No. 17/007,069 titled "Apparatuses and Methods for Providing Refresh Addresses", filed Aug. 31, 2020; pp. all pages of application as filed.
U.S. Appl. No. 17/153,555 titled "Apparatuses and Methods for Dynamically Allocated Aggressor Detection", filed Jan. 20, 2021; pp. all pages of application as filed.
U.S. Appl. No. 17/201,941 titled "Apparatuses and Methods for Sketch Circuits for Refresh Binning", filed Mar. 15, 2021; pp. all pages of application as filed.
U.S. Appl. No. 17/444,925 titled "Apparatuses and Methods for Countering Memory Attacks", filed Aug. 12, 2021; pp. all pages of application as filed.
U.S. Appl. No. 17/446,710 titled "Apparatuses, Systems, and Methods for Determining Extremum Numericalvalues", filed Sep. 1, 2021; pp. all pages of application as filed.
U.S. Appl. No. 17/470,883 titled "Apparatuses and Methods for Tracking Victim Rows", filed Sep. 9, 2021; pp. all pages of application as filed.
[English Abstract] Zheng, Bin , et al., "Design of Built-in DRAM for TFT-LCD Driver Chip LCD and display," Issue 4, Aug. 15, 2009; pp. all.

\* cited by examiner

| Action | Main | Slim | Comments |
|---|---|---|---|
| Insertion/Update | Every RA Insert (Act); Sketch Counter + 1 | When Main Counter Sketch > HT_Slim or Trigger Max RA Latch Slim Sketch = Max (Slim,Main) Value | For RA Hammer < HT, only in Main; For RA Hammer > HT, in Main and Slim |
| Query | Min(Main Sketch) | Min(Slim Sketch) | Max(Min(Slim), Min(Main)) as Final Query Value |
| Delete | Counter−Min(Main Sketch) | Counter − Min(Min(Slim), Min(Main)) | Main/Slim Delete Separately |

FIG. 4

APPARATUSES, SYSTEMS, AND METHODS FOR MAIN SKETCH AND SLIM SKETCH CIRCUIT FOR ROW ADDRESS TRACKING

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

Different memory cells may lose information at different rates (e.g., different rates of memory decay). The memory may perform auto-refresh operations by refreshing the wordlines in a sequence such that each word line is refreshed faster than the anticipated rate of information decay. Certain situations, such as certain access patterns, may cause an increased rate of data decay. To account for this, the memory may identify row addresses which should be refreshed out of sequence as part of a targeted refresh operation. While tracking accesses to each row of the memory individually may allow for the most granular control, this may be space and power inefficient. There may be a need for row address tracking which provides adequate coverage with a lessened footprint.

BRIEF DESCRIPTION OF THE DRAWINGS

FIG. 4 is a table according to some embodiments of the present disclosure.

DETAILED DESCRIPTION

Figure 1:
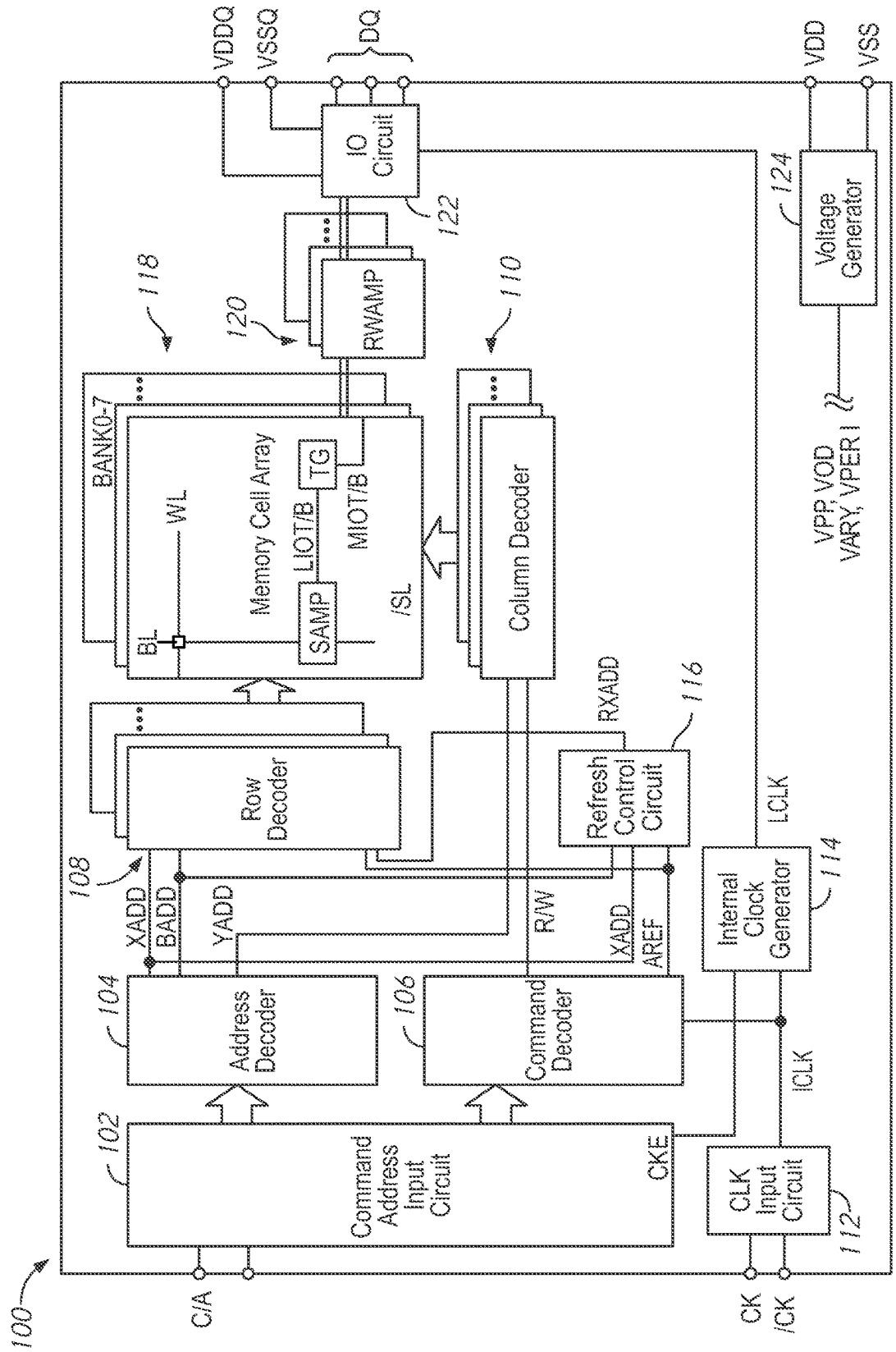
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. In order to prevent information from being lost or corrupted due to this decay, the memory may carry out a background refresh process, such as auto-refresh operations. During a refresh operation, information may be rewritten to memory cells associated with the wordline to restore their initial states. The auto-refresh operations may be performed on the wordlines of the memory in a sequence such that over a refresh cycle all word lines are refreshed.

The rate at which the refresh operations are performed may be chosen to prevent the loss of information, ideally such that each memory cell is refreshed before the information stored in that memory cell is lost. The rate at which the refresh cycle is performed may be based on an expected fastest rate of information decay. However, certain access patterns to rows of the memory (aggressor rows or aggressor word lines) may cause an increased rate of decay in the memory cells along nearby rows (victim rows or victim word lines). It may thus be important to identify these aggressor rows so that their associated victims may be refreshed as part of a targeted refresh operation outside of the normal auto-refresh sequence.

A sketch circuit may be used to track accesses to row addresses. In a sketch circuit, the row address is used as the input to a set of hash circuits, each of which provides an output value based on the row address. Since the hash functions used by the hash circuits are different (and/or are seeded differently) the output values may be different. These output values are used to index one of a number of count values, which are changed (e.g., incremented). There may be fewer states (e.g., fewer bits) of the output value from each hash circuit than there are states (e.g., bits) of the row address. Accordingly, more than one row address may lead to a same output value from a given hash circuit (e.g., a collision). This may lead to situations where the number of accesses is over counted. Similarly, when rows are refreshed and count values are changed in a second direction (e.g., decremented, reset, etc.), there may be situations where a number of accesses to a given row is undercounted. This may present problems where a row is accessed frequently enough that its victims should be refreshed, but its count is artificially lowered.

The present disclosure is drawn to sketch and slim sketch circuits for address tracking. An aggressor detector circuit of a memory may include two sketch circuits, a main sketch circuit and a slim sketch circuit. The two sketch circuits may each have their own respective sets of hash circuits. The hash circuits of the main sketch circuit may provide values which have more bits than the values provided by the hash circuits of the slim sketch circuit. Accordingly, the slim sketch circuit may have more collisions, and fewer stored count values, than the main sketch circuit.

When a row address is received the row address is provided to the main sketch circuit, which changes (e.g., increments) a set of count values, each indexed by a value from a respective hash circuit. If any of the count values exceeds a slim sketch threshold, then the row address may also be received by the slim sketch circuit, which changes (e.g., increments) a set of count values each indexed by a value from a respective hash circuit. The counts which were updated in both the main and the slim sketch circuit may be compared and minimum of the changed counts (e.g., the counts associated with the row address) may be taken from both the main and slim sketch circuits. The maximum of those two minimums is compared to a hammer threshold, and if it is greater than the hammer threshold, the row address may be stored in a queue of aggressor addresses, so that its victims may be later refreshed. This may help to reduce errors where the accesses to a given address are undercounted.

In some embodiments, the aggressor detector circuit may also track an address associated with the maximum count value in the main sketch circuit. When that address changes (e.g., when a new address's count becomes the maximum), that address may also be provided to the slim sketch circuit.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD (and in some embodiments, one more additional signals indicating the type of operation), the row decoder 108 may perform a targeted refresh or auto-refresh operation. The automatic refresh addresses may be from a sequence of addresses such that over a cycle of the sequence, all of the word lines are refreshed. For example, a counter circuit may be used to increment or otherwise 'count through' possible row address values for RXADD. The refresh control circuit 116 may cycle through the sequence of auto-refresh addresses at a rate determined by AREF. A refresh cycle may represent the auto-refresh address generator refreshing each row of the memory (e.g., providing each value of the auto-refresh address). In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 116 may use some criteria to judge whether an address is an aggressor address, which may capture potential aggressor addresses rather than definitively determining which addresses are causing data degradation in nearby victims. For example, the refresh control circuit 116 may determine potential aggressor addresses based on a pattern of accesses to the addresses and this criteria may include some addresses which are not aggressors, and miss some addresses which are. Similarly, victim addresses may be determined based on which wordlines are expected to be effected by aggressors, rather than a definitive determination of which wordlines are undergoing an increased rate of data decay.

The refresh control circuit 116 includes an aggressor detector circuit which monitors the row addresses XADD provided as part of access operations to determine which rows are aggressors. The aggressor detector circuit includes a main sketch circuit and a slim sketch circuit. The main sketch circuit receives all row addresses XADD provided along a row address bus. The main sketch circuit hashes the row address XADD into a set of hash values, each from a respective hash circuit. These hash values each act as an index for one of a set of count values associated with each hash circuit. For example, if there are i hash circuits, each of which outputs a j bit hash value, then there may be $i*2^j$ count values, with each hash circuit associated with one count value for each possible value of the hash value. Based on the hash values, the count values are updated (e.g., incremented). If any of the updated count values exceeds a slim count threshold, then the slim sketch circuit may also update a set of count values based on the row address XADD (in a manner analogous to the main sketch circuit). The values stored in the main and slim sketch circuits may in turn be used to determine if the address XADD is an aggressor. An example refresh control circuit using main and slim sketch circuits is discussed in more detail in FIG. 2.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
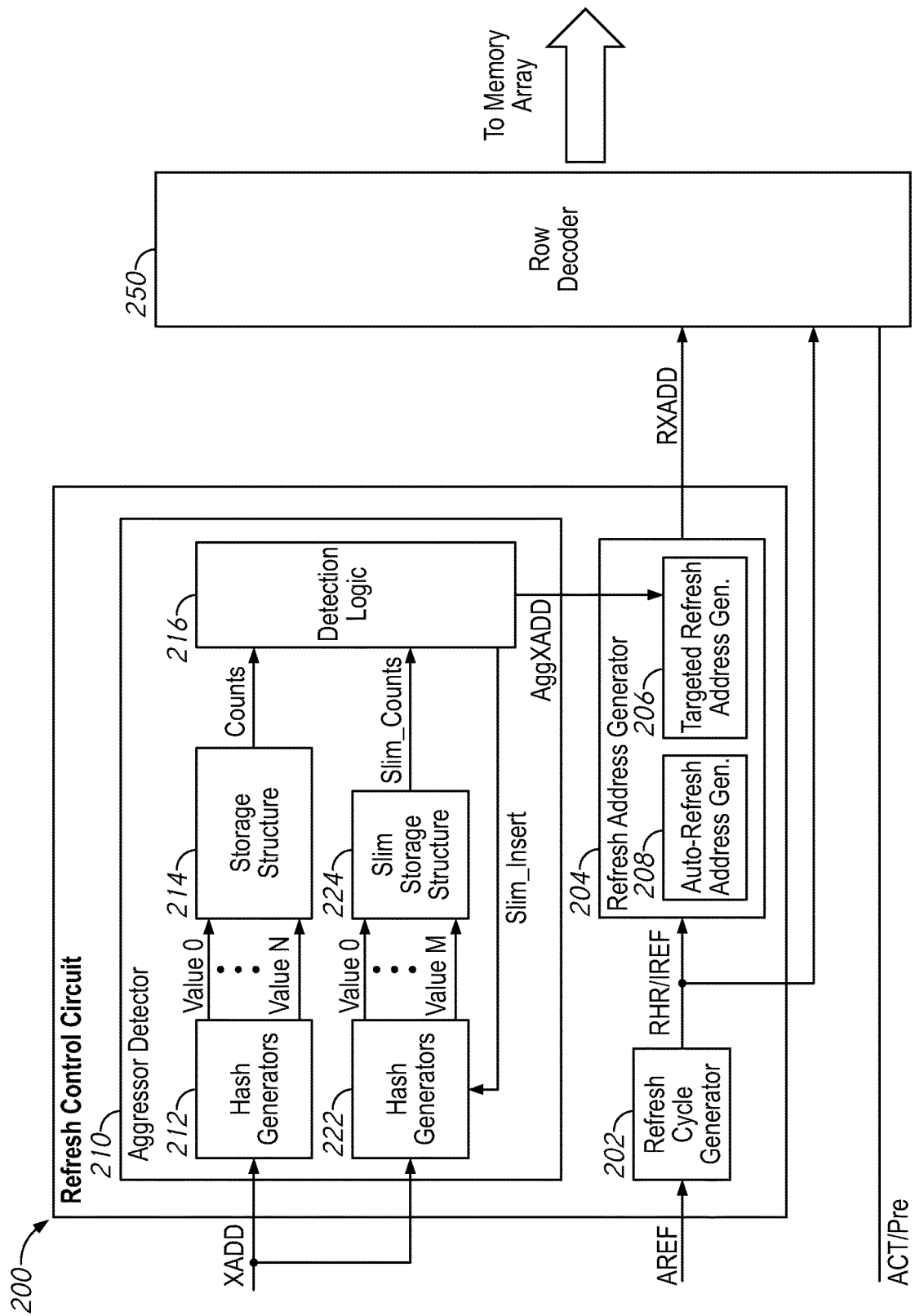
FIG. 2 is a block diagram of a refresh control circuit according to some embodiments of the present disclosure.

FIG. 2 is a block diagram of a refresh control circuit according to some embodiments of the present disclosure. The refresh control circuit 200 may, in some embodiments, be included in the refresh control circuit 116 of FIG. 1. The refresh control circuit 200 receives a refresh signal AREF which controls the timing at which the refresh control circuit 200 provides a refresh address RXADD. Also shown in FIG. 2 is a row decoder 250 (e.g., row decoder 108 of FIG. 1) which may refresh one or more wordlines of a memory array based on the refresh address RXADD.

The refresh control circuit 200 includes a refresh cycle generator 202, which receives the refresh signal AREF and determines the timing of refresh operations based the refresh signal AREF. The refresh control circuit 200 also determines if an auto-refresh operation or a targeted refresh operation should be performed and provides signals such as a targeted refresh signal RHR and an internal refresh signal IREF which indicate what type of refresh operation should be performed. The refresh control circuit 200 includes a refresh address generator 204, which generates a refresh address RXADD based, in part on the signals received from the refresh cycle generator 202. During a targeted refresh operation, a targeted refresh address generator 206 of the refresh address generator 204 may provide a targeted refresh address as RXADD, based on an aggressor address AggXADD identified by an aggressor detector. During an auto-refresh operation, an auto-refresh address generator 208 of the refresh address generator 204 may generate an auto-refresh address as RXADD. Based on the refresh address RXADD, along with other signals, such as IREF/RHR, the row decoder 250 refreshes one or more word lines of a memory array (e.g., 118 of FIG. 1) which are associated with the refresh address RXADD.

The refresh cycle generator 202 may receive the refresh signal AREF and may provide internal refresh signals IREF and/or RHR with timing based on the refresh signal AREF. The signals IREF and RHR may be used to indicate which type of refresh operation should be performed. For example in some embodiments IREF being active but RHR being inactive may indicate an auto-refresh operation, while both IREF and RHR being active may indicate a targeted refresh operation. Other patterns of signals may be used in other embodiments. Responsive to an activation of the refresh signal AREF, the refresh cycle generator 202 may indicate that one or more refresh operations should be performed. In some embodiments, responsive to a single activation of AREF, the refresh cycle generator 202 may perform a number of 'pumps' each associated with a refresh operation. In an example operation, when AREF is activated, the refresh cycle generator 202 may perform 2, 4, 6, or 8 pumps, each associated with a refresh operation. More or fewer refresh operations per activation of AREF may also be used. The refresh cycle generator 202 may use internal logic to determine whether each refresh operation should be a targeted refresh operation or an auto-refresh operation.

The refresh address generator 204 may include circuits for generating the refresh address RXADD when a targeted refresh operation is called for (e.g., when both IREF and RHR are active). The targeted refresh address generator 206 may generate targeted refresh addresses and provide them as RXADD. The refresh address RXADD may be based on an aggressor address AggXADD which has been identified by the aggressor detector 210. For example, the refresh address may represent word lines which are adjacent to the aggressor AggXADD (e.g., AggXADD+1 and AggXADD−1). Other relationships (e.g., AggXADD+/−2, AggXADD+/−3, etc.) may also be used. The targeted refresh address generator 206 may provide multiple refresh addresses based on a single identified aggressor. For example a first refresh address RXADD may correspond to a first adjacent word line (e.g., AggXADD+1) and a second refresh address RXADD provided as part of a different refresh operation (e.g., as part of a different pump) may represent a second adjacent word line (e.g., AggXADD−1).

The refresh address generator 204 may include an auto-refresh address generator 208 which may provide an auto-refresh address as RXADD responsive to an auto-refresh operation (e.g., IREF being active and RHR being inactive). The auto-refresh address may generated from a sequence of refresh addresses. For example, a counter may be used to count through the values of all possible row addresses so that over the course of a refresh cycle, all word lines are refreshed. In some embodiments, the auto-refresh address may be associated with more than one word line. For example, the auto-refresh address may be truncated compared to a normal row address (e.g., XADD in FIG. 1) and may be associated with every word line which shares that truncated portion in common.

The aggressor detector circuit 210 uses sketch data structures to store information about access counts to different row addresses XADD. Based on those access counts, a row may be identified as an aggressor, and provided as the aggressor address AggXADD. The aggressor detector 210 includes a main sketch circuit which includes a first set of hash circuits 212 and a storage structure 214 and a 'slim' sketch circuit which includes a second set of hash circuits 222 and a second storage structure 224. The terms 'main' and 'slim' are used herein only to distinguish between the two sketch circuits. The main and slim sketch circuit may include similar components and operate in similar ways. In some embodiments, the two sketch circuits may share components. Each sketch circuit includes a respective storage structure 214/224 which includes a table of count values. As explained in more detail with respect to FIG. 3, the table may have entries organized in rows indexed by a hash function in the hash circuits 212 or 222 respectively, and columns indexed by the values that the hash functions can output. It should be understood that reference to the organization of the entries in terms of rows and columns refers to ways in which the organization of the entries may be conceptualized. The entries may be physically organized in any manner.

The main sketch circuit includes a number of hash circuits 212. Each of the hash circuits 212 may receive the row address XADD in common and provide a respective value Value0 to ValueM. Each of the hash circuits 212 may receive the address XADD as an input value and provide the respective value (Value0 to ValueN) based on the address XADD. For example, there may be a number of hash circuits 212 equal to the number of output values (e.g., Hash0 to HashN) and an ith hash circuit may provide an ith output value (e.g., Hashi).

The address XADD may have a first number of bits (e.g., 17 bits). The value may have a second number of bits which is smaller than the first number. Accordingly, there may be fewer total possible states of the value than there are states of the address XADD. There may thus be collisions between input states (e.g., values of XADD) and output states (e.g., values of Value) provided by each hash circuit 212. For example, each state of Value may represent 8, 16, 32, or some other number of possible values of XADD. In some embodiment, each of the values output by the hash circuits 212 may have the same number of bits. If there are M total possible values each hash circuit 212 can provide (e.g., a number of bits k such that $2^k$=M), and there are N total hash circuits 212, then the storage structure 214 may be a table of N×M total entries.

Each of the hash circuits 212 may hash the input value (e.g., XADD) differently by implementing a different hash operation. In some embodiments, that may be due to each hash circuit 212 implementing a different hash function. In some embodiments, the differences may be due to different seed values input to each of the hash circuits 212. For example, each hash circuit 212 may have the same hash function, but may be seeded differently. In some embodiments, a mix of different hash functions and seeds may be used to vary the hash operations between the hash circuits 212.

The count values in the storage structure 214 associated with (e.g., indexed by) the provided values Value0 to ValueM (and the hash circuits which provided those values) may be retrieved and provided to a logic circuit 216. The logic circuits 216 may use the count values to determine if the current row address XADD is an aggressor address or not. If the address is an aggressor, the address XADD may be stored (e.g., in an aggressor queue) to be provided as the address AggXADD. The count values retrieved from the storage structure 214 may also be used to determine if a signal Slim_Insert should be provided. If the signal Slim_Insert is provided at an active level, then the slim hash circuit (e.g., hash circuits 222 and storage structure 224) may also receive the address XADD and update respective count values of the slim storage structure 224.

The hash circuits 222 and the slim storage structure 224 may operate in a manner analogous to the hash circuits 212 and storage structure 214 as previously described. When the signal Slim_Insert is active, the hash circuits 222 may provide a set of hashed values Value0 to ValueM, which may be used to index count values stored in the slim storage structure 224. There may be a different or same number of hash circuits in the hash circuits 212 and 222. The hash circuits 222 may generate hash values with a different number of bits than the hash values generated by the hash circuits 212. For example, the values hashed by the hash circuits 222 may have fewer bits than the values hashed by the hash circuits 212. Accordingly, if there are P hash circuits in the hash circuits 222, and each hashed value has L different states, then the slim storage structure 224 may be a table of P×L count values. The slim storage structure 224 may generally store fewer count values than the storage structure 214. Responsive to the values from the hash circuits 222, the slim storage structure may provide a set of count values Slim_Counts.

As described in more detail herein, the detection logic 216 may change the count values Counts and/or Slim_Counts. For example, the count values Counts and/or Slim_Counts may be incremented to indicate that a row address XADD associated with that count value has been accessed. The detection logic 216 may use the count values Counts and/or Slim_Counts to determine if the address XADD is an aggressor (e.g., by comparing one or more of the Counts and Slim_Counts to a threshold). If the address XADD is an aggressor, the detection logic 216 may also delete (e.g., by subtracting a minimum count value) one or more of the Counts or Slim_Counts, to indicate that the address XADD has been placed in a queue of aggressor addresses.

In some embodiments, the aggressor detector circuit 210 may use different methods to determine if the address XADD is an aggressor address or not. For example, one method may be to compare one or more of the counts Counts and/or Slim_Counts to a threshold. Another method may be to take the address associated with the maximum value of the counts Counts and/or Slim_Counts, regardless of if that value exceeds a threshold or not. The address associated with the current maximum count value may be saved, and may be updated if a different address's count(s) surpasses it. In some embodiments, the aggressor detector 210 may use multiple methods. For example, the counts may be compared to a threshold, and the address associated with a current maximum may both be used.

Similarly, different criteria may be used to determine when the provide the signal Slim_Insert and update the slim sketch circuit. For example, one or more of the count values Counts may be compared to a threshold and/or each time the address associated with the maximum count value is updated, the signal Slim_Insert may be provided. The threshold used to determine if the signal Slim_Insert should be provided may be the same or different than the threshold used to determine if the address is an aggressor.

Figure 3:
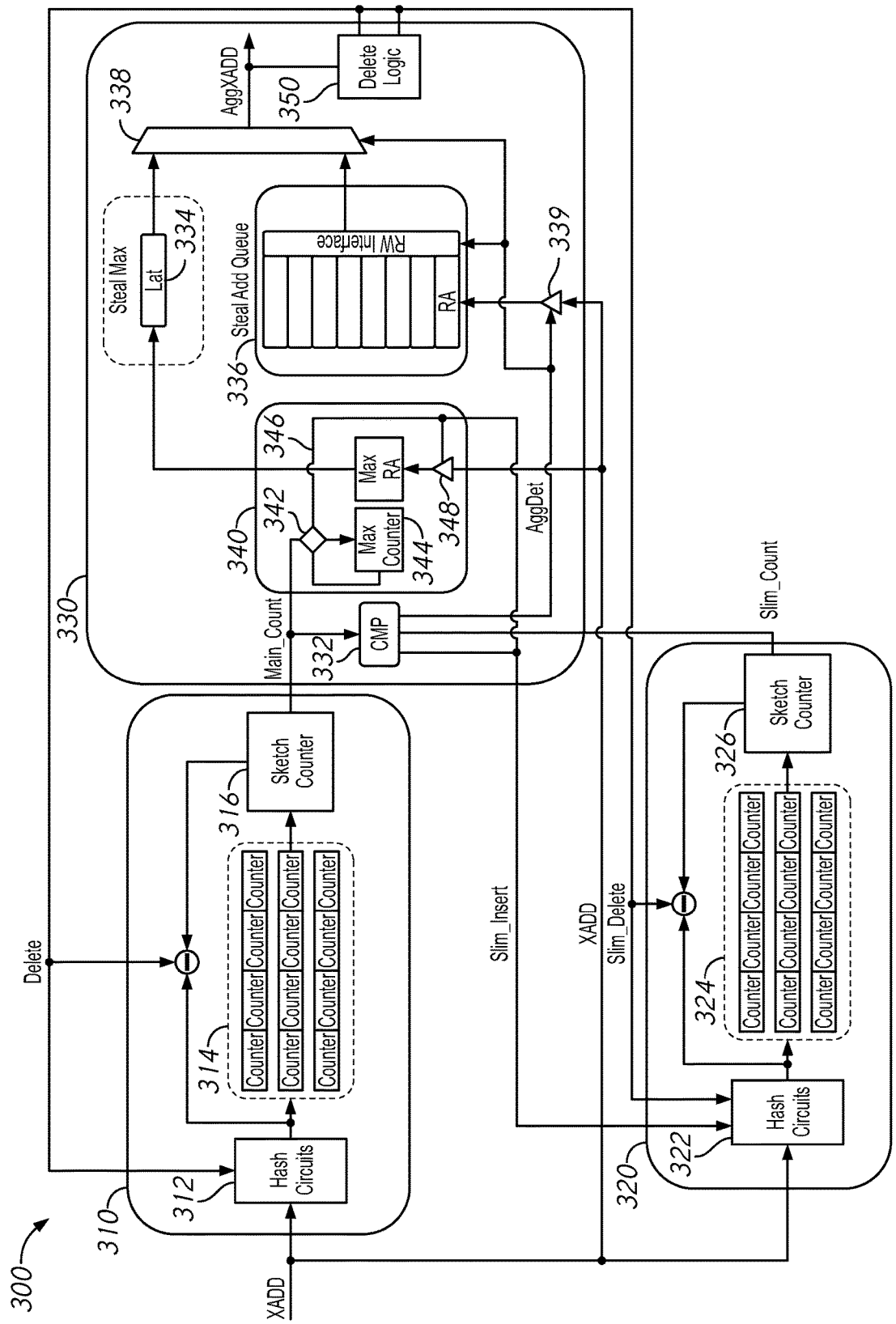
FIG. 3 is a block diagram of an aggressor detector circuit according to some embodiments of the present disclosure.

FIG. 3 is a block diagram of an aggressor detector circuit according to some embodiments of the present disclosure. The aggressor detector circuit 300 may, in some embodiments, be included in the aggressor detector 200 of FIG. 2. The aggressor detector 300 includes a main sketch circuit 310 and slim sketch circuit 320, along with logic 330 (e.g., 216 of FIG. 2). The example aggressor detector 300 shows an embodiment where the counts are compared to a threshold to determine if the address XADD is an aggressor so that the address can be stored in a refresh address queue 336. The aggressor detector 300 also saves an address associated with a maximum count is also saved to be provided as the aggressor if an address is needed for a targeted refresh but no counts are stored in the queue 336.

The aggressor detector 300 includes a main sketch circuit 310 and a slim sketch circuit 320. As both circuits may be generally similar, only the main sketch circuit 310 is described in detail herein. The main sketch circuit 310 includes a set of hash generators 312 (e.g., 212 of FIG. 2) which receive a row address XADD provided as part of an access operation (e.g., a read or write operation) in the memory. The hash generators 312 include a number of hash circuits each of which provide a hash value based on the row address XADD. For example, if the hash generator 312 includes 3 hash circuits, then 3 hash values are produced. Each hash circuit may implement a different hash function (and/or a same hash function but seeded differently, etc.) such that the hash values are independent from each other.

The hash values are used to index a set of counts in a data storage structure 314 (e.g., 214 of FIG. 2). For example, if each of the hash values is an 6 bit number then there may be 64 unique values that any given hash value can have. Thus, the storage structure may include 64 different count values on each row, and a number of rows equal to the number of hash circuits in the hash circuits 312. For clarity of illustration, only some of the rows and columns are shown in FIG. 3. Each count value may be a binary number which indicates a number of accesses.

Based on the received hash values from the hash circuits 312, the indexed count values are provided to a counter circuit 316. The counter circuit 316 may adjust the indexed count values. For example, the counter circuit 316 may increment the indexed count values. The counter circuit 316 may compare the indexed count values to each other, and provide a minimum of those counts as the Main_Count. Responsive to a signal Delete at an active level. A delete logic circuit 350 may provide the activation of Delete responsive to an aggressor address AggXADD being provided by the multiplexer 338. Responsive to the activation of Delete the minimum count value associated with the current address XADD may be subtracted from all of the count values associated with XADD.

The main counter circuit 316 may provide the minimum of the count values associated with the current row address XADD to a detection logic circuit 330. The detection logic 330 includes a comparator 332, which compares the current count value to a slim threshold to determine if an activation of the signal Slim_Insert should be provided. If the Main_Count (which is the minimum of the counts indexed by the hash values) is greater than the slim threshold, then an activation of the signal Slim_Insert is provided. As described in more detail herein, comparator 332 may also compare one or more of the main count Main_Count and a slim count from the slim sketch circuit 320 to an aggressor threshold to determine if an activation of an aggressor detected signal AggDet should be provided. The slim threshold and the aggressor threshold may be the same and/or may be different. One or both of the thresholds may be a setting a of the memory.

The slim sketch circuit 320 may generally have similar components and operations to the main sketch circuit 310, except that the slim sketch circuit 320 only responds to the row address XADD when there is an activation of the signal Slim_Insert (e.g., when the Main_Count exceeds a threshold in the comparator circuit 332). The slim sketch circuit 320 includes a set of hash circuits 322 which provide a set of hash values based on the row address XADD when there is an activation of Slim_Insert. Those hash values are used to index a table of count values in a storage structure 324 (e.g., 224 of FIG. 2). The slim storage structure 324 may include less entries than the main storage structure 224. For example, each hash value provided by the slim hash circuits 322 may include fewer bits, and thus there may be fewer "columns" in the slim storage structure 324. For example, the slim hash values may be 3 bit numbers, and thus there may be 8 columns. If there are 3 hash circuits in the harsh circuits 322, then the storage structure 324 may include 3×8 count values.

The indexed count values are provided to a counter circuit 326. The counter circuit 326 may update the indexed count values. For example, the counter circuit 326 may compare the indexed count values to the count values indexed in the main storage structure 314, and may set the indexed count values of the slim storage structure 324 to the maximum of the indexed count values in main storage structure 314 and slim storage structure 324. The count values may be compared and a minimum of the of the indexed count values may be provided as a value Slim_Count.

The delete logic circuit 350 may generate a Slim_Delete signal separately from the signal Delete. When a delete signal Slim_Delete is received, the slim sketch circuit 320 may compare the indexed count values with the indexed count values in the main sketch storage structure 314. The minimum of the indexed counts in the main storage structure 314 Main_Count may be compared to the minimum of the indexed counts in the slim storage structure 324. A minimum of Slim_Count and Main_Count may then be subtracted from all of the count values associated with the row address XADD.

If the comparator only receives the Main_Count (e.g., an activation of Slim_Insert is not provided) then the count Main_Count is compared to an aggressor threshold. If both Main_Count and Slim_Count are received (e.g., an activation of Slim_Insert was provided) then the comparator 332 may compare a maximum of Main_Count and Slim_Count to the aggressor threshold. If the aggressor threshold is exceeded, then an activation of a signal AggDet is provided. Responsive to an activation of AggDet, the current row address XADD is captured in a refresh address queue 336.

Capture logic 339 provides the row address XADD responsive to an activation of AggDet and provides it to the queue 336. The queue 336 may be a storage structure which holds a number of addresses. A multiplexer 338 provides one of the addresses stored in the queue 336 as the aggressor address AggXADD responsive to the activation of AggDet.

The aggressor detector 300 also includes logic to store and provide a row address associated with a maximum of the minimum indexed count values for that address in the main count storage structure 314. The main count Main_Count is provided to a maximum detection logic circuit 340. The maximum count logic 340 includes a maximum count storage structure 344 and an address storage structure 346. The maximum count storage structure 344 holds a maximum count value and the address storage structure 346 holds an address associated with that count value. A comparator 342 compares the main count Main_Count to the stored count value in the maximum count storage structure 344. If the count Main_Count is greater than the stored count, a signal is sent to capture logic 348 to replace the value stored in the counter storage 344 with the value of Main_Count and to replace the stored address in the address storage 346 with XADD. This signal may also act as the signal Slim_Insert and thus, the slim sketch circuit 320 may receive the row address XADD when the value Main_Count exceeds a threshold, or when it is greater than the stored maximum count in the count storage 344.

The address from the address storage 346 is stored in a latch circuit 334. A multiplexer 338 provides the aggressor address AggXADD. If the signal AggDet is activated, indicating that there is at least one address in the refresh queue 336, then the address from the address queue 336 is provided as AggXADD and an activation the signal Delete is provided by the delete logic circuit 350. Otherwise the address in the latch 334 is provided as the address AggXADD.

FIG. 4 is a table according to some embodiments of the present disclosure. The table 400, may represent a set of behaviors of an example aggressor detector circuit, such as 210 of FIGS. 2 and/or 300 of FIG. 3. The table shows three rows, each for one of the actions that can be performed by the sketch circuit, updating the values in the storage structure, querying the values in the storage structure, or deleting one or more values in the storage structure. The columns represent the behavior of the main sketch circuit (e.g., 310 of FIG. 3), the slim sketch circuit (e.g., 320 of FIG. 3) or further commentary on the behavior.

When a row address is received, the example main sketch circuit may respond to every row address (e.g., each time the signal ACT is active). Responsive to the row address, the count values associated with that row address (e.g., indexed by the hash values generated from the row address) may be incremented. In the slim sketch circuit, the row address is only received when one or more of the counts in the main sketch circuit associated with that row address (e.g., a minimum of the associated count values) exceeds a slim insertion threshold HT_slim or when a maximum row address is replaced (e.g., a count value exceeds the stored count in the count storage 344 of FIG. 3). In the slim sketch circuit, when the row address is received, the count values in the slim sketch circuit are set to a maximum value of the count values in the main and slim sketch circuit which are associated with that row address.

The count values which are provided from the main sketch circuit and the slim sketch circuit (e.g., as part of a query) may represent the minimum of the count values in each respective sketch circuit which are associated with the row address. The overall determination of if that count is greater than a hammer threshold may be based on a maximum of the two minimum count values.

The main and slim sketch circuits may have separately triggered delete behaviors (e.g., by separate delete signals). When a delete operation is triggered in the main sketch circuit, the minimum value of the count values associated with the row address is subtracted from the other count values associated with the row address. When a delete operation is triggered in the slim sketch circuit, a minimum of the minimum counts associated with the address in both sketch circuits is found and subtracted from the count values associated with the row address in the slim sketch circuit.

Figure 5:
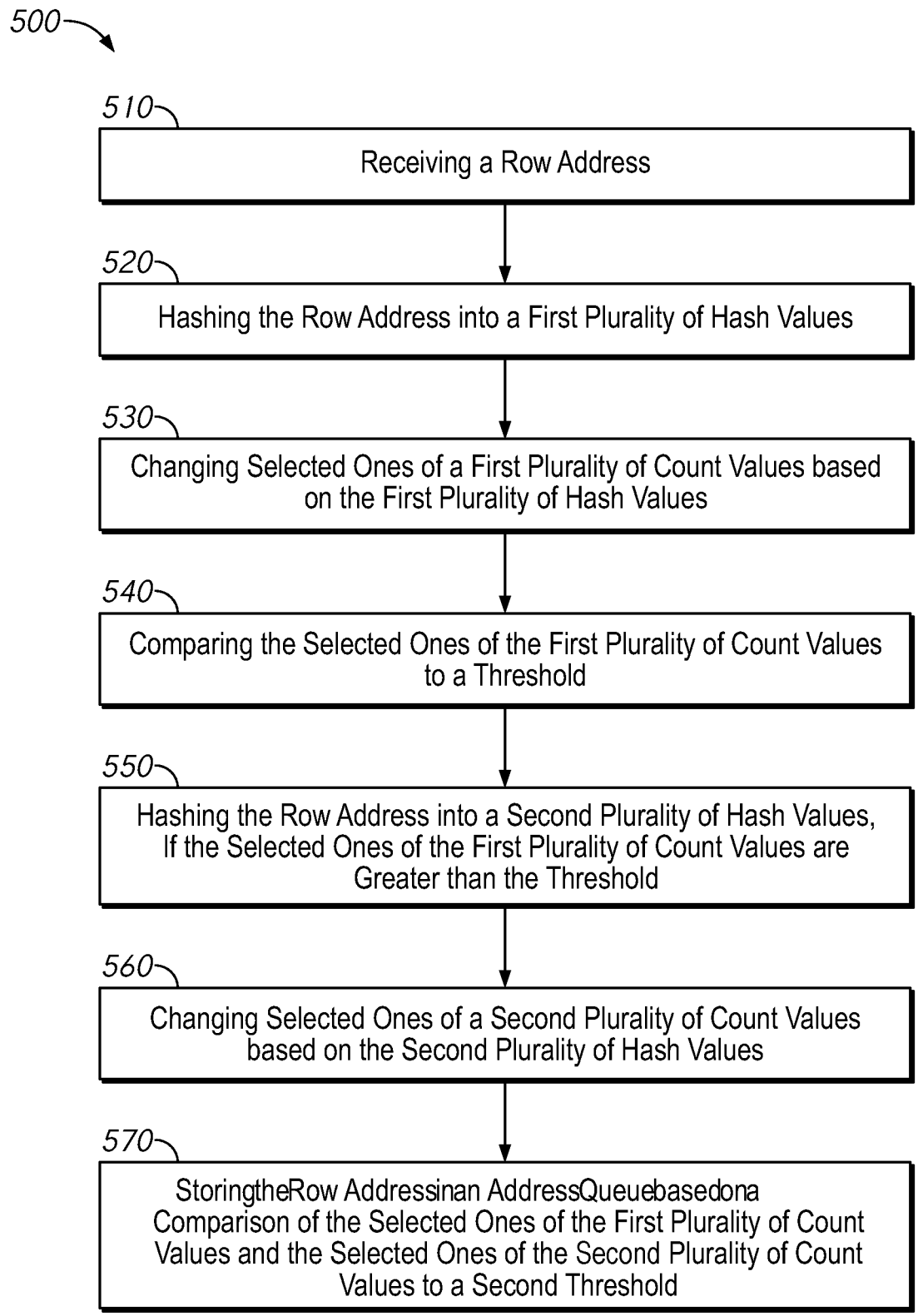
FIG. 5 is a flow chart of a method according to some embodiments of the present disclosure.

FIG. 5 is a flow chart of a method according to some embodiments of the present disclosure. The method 500 may, in some embodiments, be implemented using any of the apparatuses or systems described herein.

The method 500 includes box 510 which describes receiving a row address. The row address may be part of an access operation, and may be accompanied by other signals such as ACT. The row address may be received by an aggressor detector circuit (e.g., 210 of FIGS. 2 and/or 300 of FIG. 3).

The method 500 includes box 520 which describes hashing the row address into a first plurality of hash values, for example with a first set of hash circuits (e.g., 212 of FIGS. 2 and/or 312 of FIG. 3). Each hash value of the first plurality of hash values may be generated using a different hash function (and/or a same hash function seeded differently, etc.)

The method 500 includes block 530, which describes changing selected ones of the first plurality of count values based on the first plurality of hash values. The selected ones of the first plurality of count values may be selected based on respective ones of the first plurality of hash values. For example, each of the first plurality of hash values may index a count value along a row, where the row is associated with the hash circuit that generated that hash value. The selected count values may be incremented.

The method 500 includes block 540, which describes comparing the selected ones of the first plurality of count values to a threshold. For example, a minimum one of the selected ones of the first plurality of count values may be compared to the threshold. If the minimum value is greater than the threshold, then the method may proceed to box 550. If the minimum value is not greater than the threshold, it may be compared to a second threshold, and if greater than the second threshold, the row address may be stored in an address queue.

The method 500 includes block 550, which describes hashing the row address into a second plurality of hash values, if the selected ones of the first plurality of count values are greater than the threshold. For example, a comparator (e.g., 332 of FIG. 3) may provide a slim insert signal when at least one of the selected ones of the first counts is above the threshold. A slim sketch circuit (e.g., 320 of FIG. 2) may receive the row address signal when there is an activation of the slim insert signal, and may generate the hash values in a manner analogous to what was described with respect to box 520.

The method 500 includes box 560 which describes changing selected ones of a second plurality of count values based on the second plurality of hash values. This may be generally analogous to box 530, except the manner in which the counts in the slim storage structure are changed may be different. For example, the selected ones of the second plurality of count values may be set to a maximum of the selected ones of the first count values and the selected ones of the second count values.

The method 500 includes box 570 which describes storing the row address in an address queue based on a comparison of the selected ones of the first plurality of count values and the selected ones of the second plurality of count values to a second threshold. For example, a maximum of the minimum of the selected ones of the first count values and the minimum of the selected ones of the second count values may be compared to the second threshold. If that maximum exceeds the second threshold, the address may be added to the address queue. The addresses in the queue may be provided as aggressor addresses and targeted refresh addresses may be generated based on the aggressor addresses for refreshing as part of targeted refresh operations.

In some embodiments, the method 500 may optionally include comparing the selected ones of the first plurality of count values to a stored maximum count value. If a minimum of the selected ones of the first count values exceeds the stored maximum, then that count is stored as the new maximum, and the row address is also stored. If the minimum of the selected ones of the first count values exceeds the stored maximum, the signal slim insert may also be provided, causing the method to proceed to box 550 even if the selected ones of the first plurality of count values do not exceed the threshold. The stored row address may be provided as the aggressor address if the address queue is empty.

As used herein, an activation of a signal may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level. One of skill in the art should understand that although embodiments may be described with respect to a particular type of activation used by a particular circuit (e.g., active high), other embodiments may use other types of activation (e.g., active low).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a refresh control circuit comprising:
a first sketch circuit configured to update selected ones of a first plurality of count values based on a row address;
a second sketch circuit configured to update selected ones of a second plurality of count values based on the row address when at least one of the selected ones of the first plurality of count values exceeds a first threshold;
a targeted refresh queue configured to store the row address when a maximum of the minimum of the selected ones of the first plurality of count values and the minimum of the selected ones of the second plurality of count values exceeds a second threshold; and
a refresh address generator configured to generate a targeted refresh address based on the row address in the targeted refresh queue.

2. The apparatus of claim 1, wherein the first sketch circuit includes:
a first plurality of hash circuits configured to generate a respective one of a first plurality of hash values based on the row address;
a first storage structure configured to store the first plurality of count values, wherein the selected ones of the first plurality of count values are selected based on the first plurality of hash values;
a second plurality of hash circuits configured to generate a respective one of a second plurality of hash values based on the row address;
a second storage structure configured to store the second plurality of count values, wherein the selected ones of the second plurality of count values are selected based on the second plurality of hash values.

3. The apparatus of claim 2, wherein each of the first plurality of hash values have a first number of bits, and wherein each of the second plurality of hash values have a second number of bits smaller than the first number of bits.

4. The apparatus of claim 1, wherein there are a first number of the first plurality of count values and a second number of the second plurality of count values, wherein the second number is smaller than the first number.

5. The apparatus of claim 1, further comprising a maximum count logic circuit configured to store an address associated with a maximum of the first plurality of count values.

6. The apparatus of claim 5, wherein the maximum count logic circuit is configured to compare the minimum of the selected ones of the first plurality of count values to a stored count, and to store the minimum and the row address if the minimum exceeds the stored count, and wherein the second sketch circuit is further configured to update the selected ones of the second plurality of count values based on the minimum of the selected ones of the first plurality of count values exceeding the stored count in the maximum count logic circuit.

7. The apparatus of claim 5, wherein the address stored in the maximum logic circuit is provided to the refresh address generator if the targeted refresh queue is empty.

8. The apparatus of claim 1, further comprising:
a first counter circuit configured to update the selected ones of the first plurality of count values by incrementing them; and
a second counter circuit configured to update the selected ones of the second plurality of count values by setting them equal to a maximum of the selected ones of the first plurality of count values and the selected ones of the second plurality of count values.

9. An apparatus comprising:
a first plurality of hash circuits configured to receive a row address and provide a respective one of a first plurality of hash values based on the row address;
a first storage structure comprising a first plurality of count values, wherein selected ones of the first plurality of count values are changed responsive to the first plurality of hash values, and wherein based on a comparison of the selected ones of the first plurality of count values to a first threshold an activation of a command signal is provided;
a second plurality of hash circuits configured to receive the row address responsive to the activation of the command signal, and configured to provide a respective one of a second plurality of hash values based on the row address;
a second storage structure comprising a second plurality of count values, wherein selected ones of the second plurality of count values are changed responsive to the second plurality of hash values, wherein there are a first number of the first plurality of count values and a second number of the second plurality of count values, and wherein the second number is smaller than the first number; and
an address queue configured to store the row address based on a comparison of the selected ones of the first plurality of count values and the selected ones of the second plurality of count values to a second threshold.

10. The apparatus of claim 9, further comprising a comparator circuit configured to provide a second command signal when a maximum one of the minimum of the selected ones of the first plurality of count values and a minimum of the selected ones of the second plurality of count values exceeds the second threshold, and wherein the address queue is configured to store the row address based on the second command signal.

11. An apparatus comprising:
a first plurality of hash circuits configured to receive a row address and provide a respective one of a first plurality of hash values based on the row address;
a first storage structure comprising a first plurality of count values, wherein selected ones of the first plurality of count values are changed responsive to the first plurality of hash values, and wherein based on a comparison of the selected ones of the first plurality of count values to a first threshold an activation of a command signal is provided, wherein the command signal is provided when a minimum of the selected ones of the first plurality of count values exceeds the first threshold;
a second plurality of hash circuits configured to receive the row address responsive to the activation of the command signal, and configured to provide a respective one of a second plurality of hash values based on the row address;
a second storage structure comprising a second plurality of count values, wherein selected ones of the second plurality of count values are changed responsive to the second plurality of hash values; and
an address queue configured to store the row address based on a comparison of the selected ones of the first plurality of count values and the selected ones of the second plurality of count values to a second threshold.

12. The apparatus of claim 9, further comprising:
a first counter circuit configured to update the selected ones of the first plurality of count values by incrementing them; and
a second counter circuit configured to update the selected ones of the second plurality of count values by setting them equal to a maximum of the selected ones of the first plurality of count values and the selected ones of the second plurality of count values.

13. The apparatus of claim 9, further comprising a maximum count logic circuit configured to compare a minimum of the selected ones of the first plurality of count values to a stored count, and to store the minimum and the row address if the minimum exceeds the stored count, and wherein the second sketch circuit is further configured to update the selected ones of the second plurality of count values based on the minimum of the selected ones of the first plurality of count values exceeding the stored count in the maximum count logic circuit.

14. An apparatus comprising:
a first plurality of hash circuits configured to receive a row address and provide a respective one of a first plurality of hash values based on the row address;
a first storage structure comprising a first plurality of count values, wherein selected ones of the first plurality of count values are changed responsive to the first plurality of hash values, and wherein based on a comparison of the selected ones of the first plurality of count values to a first threshold an activation of a command signal is provided;
a second plurality of hash circuits configured to receive the row address responsive to the activation of the command signal, and configured to provide a respective one of a second plurality of hash values based on the row address;
a second storage structure comprising a second plurality of count values, wherein selected ones of the second plurality of count values are changed responsive to the second plurality of hash values;
an address queue configured to store the row address based on a comparison of the selected ones of the first plurality of count values and the selected ones of the second plurality of count values to a second threshold; and
a delete logic circuit configured to provide a first delete signal or a second delete signal, wherein responsive to the first delete signal a minimum of the selected ones of the first plurality of count values is set to an initial value, and wherein responsive to the second delete signal a minimum of the minimum of the first plurality of count values and the minimum of the second plurality of count values is set to the initial value.

15. A method comprising:
receiving a row address;
hashing the row address into a first plurality of hash values;
changing selected ones of a first plurality of count values based on the first plurality of hash values;
comparing the selected ones of the first plurality of count values to a threshold;
hashing the row address into a second plurality of hash values, if the selected ones of the first plurality of count values are greater than the threshold;
changing selected ones of a second plurality of count values based on the second plurality of hash values; and
storing the row address in an address queue based on a comparison of the selected ones of the first plurality of count values and the selected ones of the second plurality of count values to a second threshold,
wherein there are a first number of the first plurality of count values and a second number of the second plurality of count values, wherein the second number is smaller than the first number.

16. The method of claim 15, further comprising storing the row address in the address queue based on a comparison of a minimum of the selected ones of the first plurality of count values to the second threshold if the minimum of the selected ones of the first plurality of count values are not greater than the threshold.

17. The method of claim 15, further comprising comparing a maximum of a minimum of the selected ones of the first plurality of count values and a minimum of the selected ones of the second plurality of count values to the second threshold, wherein the row address is stored in the address queue responsive to the maximum exceeding the second threshold.

18. The method of claim 15, further comprising:
comparing a minimum of the first plurality of count values to a stored count value;
replacing the stored count value with the minimum if the minimum exceeds the stored count value;
storing the row address as a stored maximum row address if the minimum exceeds the stored count value.

19. The method of claim 18, further comprising generating a refresh address based on the row address in the row address queue or the stored maximum row address.

20. The method of claim 15, further comprising:
changing the selected ones of the first plurality of count values by incrementing them; and
changing the selected ones of the second plurality of count values by setting them to a maximum of the selected ones of the first plurality of count values and the selected ones of the second plurality of count values.

* * * * *